(12) United States Patent (10) Patent No.: US 7,622,958 B2
Moriwaki (45) Date of Patent: Nov. 24, 2009

(54) SEMICONDUCTOR DEVICE INCLUDING CURRENT-DRIVEN DIFFERENTIAL DRIVER AND METHOD OF CONTROLLING CURRENT-DRIVEN DIFFERENTIAL DRIVER (75) Inventor: Isamu Moriwaki, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 32 days.

(21) Appl. No.: 11/826,352

(22) Filed: Jul. 13, 2007

(65) Prior Publication Data

US 2008/0018363 A1   Jan. 24, 2008

(30) Foreign Application Priority Data

Jul. 18, 2006   (JP)   ............... 2006-195406

(51) Int. Cl.
    *H03K 19/094*   (2006.01)
(52) U.S. Cl. ................ 326/83; 326/27; 327/108
(58) Field of Classification Search ......... 326/82, 326/83, 86, 87, 26–28; 327/108–112
    See application file for complete search history.

(56) References Cited

U.S. PATENT DOCUMENTS

2002/0173090 A1* 11/2002 Nakada et al. ............... 438/200
2004/0189354 A1*  9/2004 Yanagihara ................. 327/112

FOREIGN PATENT DOCUMENTS

| JP | 2001-285053 | 10/2001 |
| JP | 2004-287533 | 10/2004 |
| JP | 2004-289750 | 10/2004 |

* cited by examiner

*Primary Examiner*—James H. Cho
*Assistant Examiner*—Jany Tran
(74) *Attorney, Agent, or Firm*—Dickstein Shapiro LLP (57) ABSTRACT A semiconductor device includes a current-driven differential driver and a control circuit. The current-driven differential driver is configured to generate a pair of signals having levels relative to each other from a serial signal input therein and output a current from a current source included therein through an output node according to each of the signals. The control circuit controls the current-driven differential driver to pass the current from the current source as a throwaway current therein during a second predetermined time after an input of the serial signal stops and to block the throwaway current after the second predetermined time passes.

11 Claims, 6 Drawing Sheets

SEMICONDUCTOR DEVICE INCLUDING CURRENT-DRIVEN DIFFERENTIAL DRIVER AND METHOD OF CONTROLLING CURRENT-DRIVEN DIFFERENTIAL DRIVER

CROSS-REFERENCE TO RELATED APPLICATIONS

This application claims priority to Japanese Patent Application No. 2006-195406, filed Jul. 18, 2006, the disclosure of which is hereby incorporated by reference in its entirety.

FIELD OF THE INVENTION

The present invention generally relates to a semiconductor device including a current-driven differential driver and a method for controlling a current-driven differential driver.

BACKGROUND OF THE INVENTION

USB (Universal Serial Bus) and IEEE-1394 (IEEE Standard for a High Performance Serial Bus) are widely used as standards to interface various devices, for example, PCs, printers, scanners, DVD drives, digital video cameras, etc. In recent years, USB and IEEE-1394 have been attracting attention as interfaces for data transferring on cellular telephones, mobile music players, etc.

USB 2.0 interfaces have a maximum transfer speed of 480 Mbps. IEEE-1394 interfaces have a maximum transfer speed of 400 Mbps. Because the data transfer speeds of USB interfaces and IEEE-1394 interfaces are high, data is sent or received by using low voltage differential signals (small amplitude differential signals). A current-driven differential driver is used to send the data.

In an example current-driven differential driver, a current source included in the current-driven differential driver requires time to stabilize the performance thereof when the current-driven differential driver switches from a no-output state to an output state. In a known method for constantly stabilizing the current source, the current-driven differential driver passes a current therein as a throwaway current even at the no-output state when data is transferred at high speed.

However, power saving is required in cellular telephones, mobile music players, etc. Therefore, a method for saving such a throwaway current has been proposed. One type of current-driven differential driver includes a current source, a throwaway current path, and a switching device provided in the throwaway current path. The switching device prevents the throwaway current from flowing when no data is transferred. In this method, the switching device is turned on before each time data is transferred. The switching device is turned on at the timing to allow an adequate time for the current source to be stabilized. Therefore, waiting time is required for each time data is transferred.

BRIEF SUMMARY OF THE INVENTION

Various example embodiments disclosed herein describe a semiconductor device including a current-driven differential driver and a method for controlling a current-driven differential driver.

In one example embodiment, a semiconductor device includes a current-driven differential driver and a control circuit. The current-driven differential driver is configured to generate a pair of signals having levels relative to each other from a serial signal input therein and output a current from a current source included therein through an output node according to each of the signals. The control circuit controls the current-driven differential driver to pass the current from the current source as a throwaway current which is not for an operation therein during a second predetermined time after an input of the serial signal stops and to block the throwaway current after the second predetermined time passes.

In one example embodiment, a method of controlling a current-driven differential driver configured to generate a pair of signals having conflicting levels from a serial signal input therein and output a current from a current source included therein through an output node according to each of the signals includes passing the current from the current source as a throwaway current which is not for an operation therein during a second predetermined time after an input of the serial signal stops, and blocking the throwaway current after the second predetermined time passes.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

Figure 1:
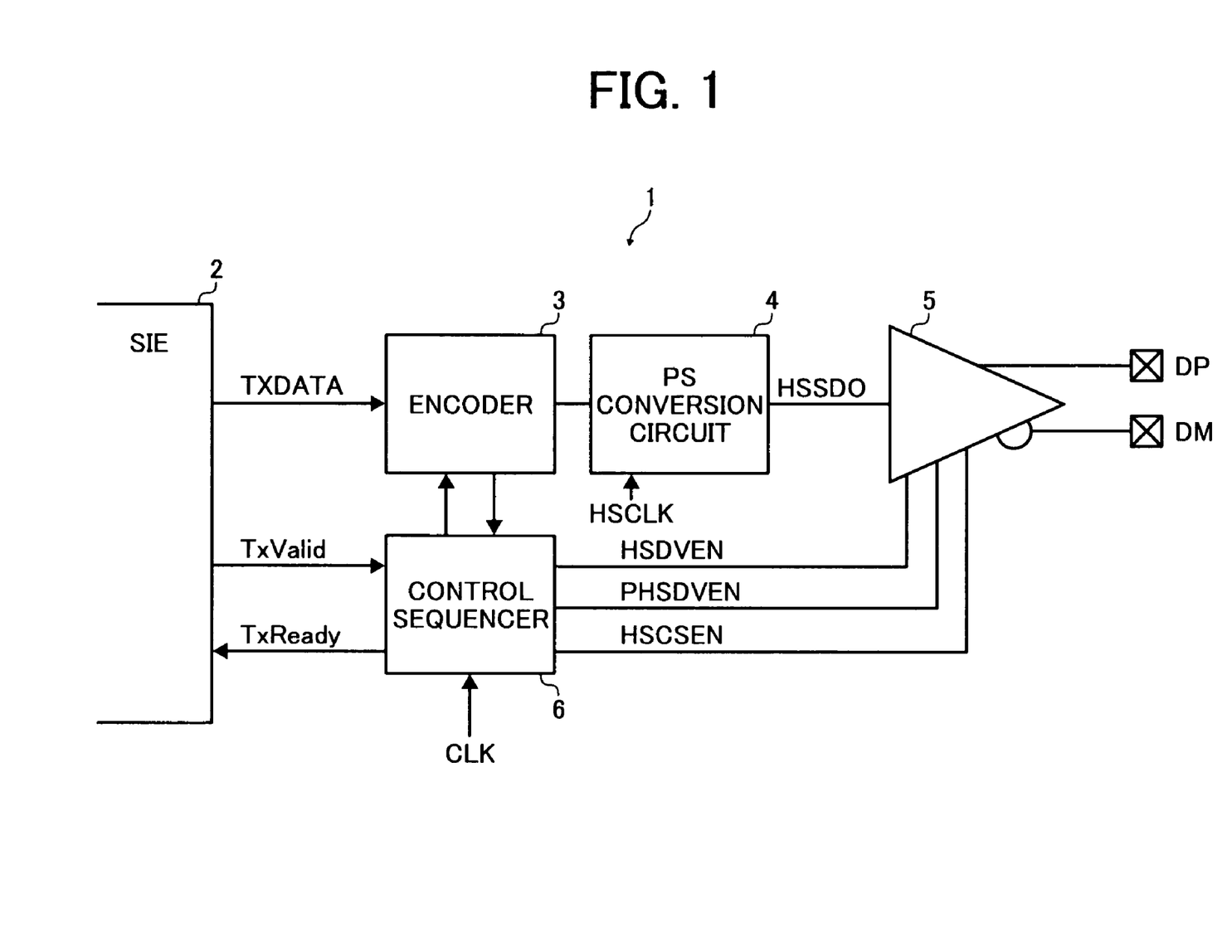
FIG. 1 illustrates an example semiconductor device according to an embodiment of the present invention.

Referring now to the drawings, wherein like reference numerals designate identical or corresponding parts throughout the several views, particularly to FIG. 1, an example configuration of a semiconductor device 1, which is a USB Transceiver Macrocell Interface, according to an embodiment of the present invention is described.

The semiconductor device 1 may include a Serial Interface Engine (SIE) 2, an encoder 3, a parallel-to-serial conversion circuit (PS conversion circuit) 4, a current-driven differential driver 5, and a control sequencer 6. The current-driven differential driver 5 includes output terminals DP and DM and a constant current source.

The SIE 2 may process data by bytes or words and output a parallel data signal TXDATA. The encoder 3 encodes the parallel data signal TXDATA in a predetermined or desirable method according to USB standards. The PS conversion circuit 4 converts the encoded parallel data signal into a serial data signal HSSDO (HS Serial Data Output).

The serial data signal HSSDO is input into the current-driven differential driver 5. The SIE 2 also outputs a predetermined or desirable request signal TxValid to the control sequencer 6 when outputting the parallel data signal TXDATA. The control sequencer 6 outputs an acknowledge signal TxReady to the SIE 2 in response to the request signal TxValid. The control sequencer 6 generates and outputs control signals HSDVEN (HS Driver Output Enable), PHSDVEN (Pre HS Driver Output Enable), and HSCSEN (HS Driver Current Source Enable) to the current-driven differential driver 5.

The control signal HSDVEN is a signal to permit a data output in a high-speed transferring mode (HS transferring mode). The control signal PHSDVEN is a signal to control a current output from the current source in the current-driven differential driver 5. The control signal HSCSEN is a signal to assert the high-speed level when the HS transferring mode is selected.

The current-driven difference driver 5 generates a pair of differential signals from the serial data signal HSSDO, according to the control signals HSDVEN, PHSDVEN, and HSCSEN input from the control sequencer 6. The levels of the differential signals conflict with each other. The current-driven differential driver 5 outputs a current through either of the output terminals DP and DM, according to each of the differential signals.

A clock signal HSCLK having a frequency corresponding to the HS transferring mode is input into the PS conversion circuit 4. The PS conversion circuit 4 executes parallel-to-serial converting based on the clock signal HSCLK. A clock signal CLK is input into the control sequencer 6. The control sequencer 6 operates based on the clock signal CLK and controls the operations of the encoder 3.

Figure 2:
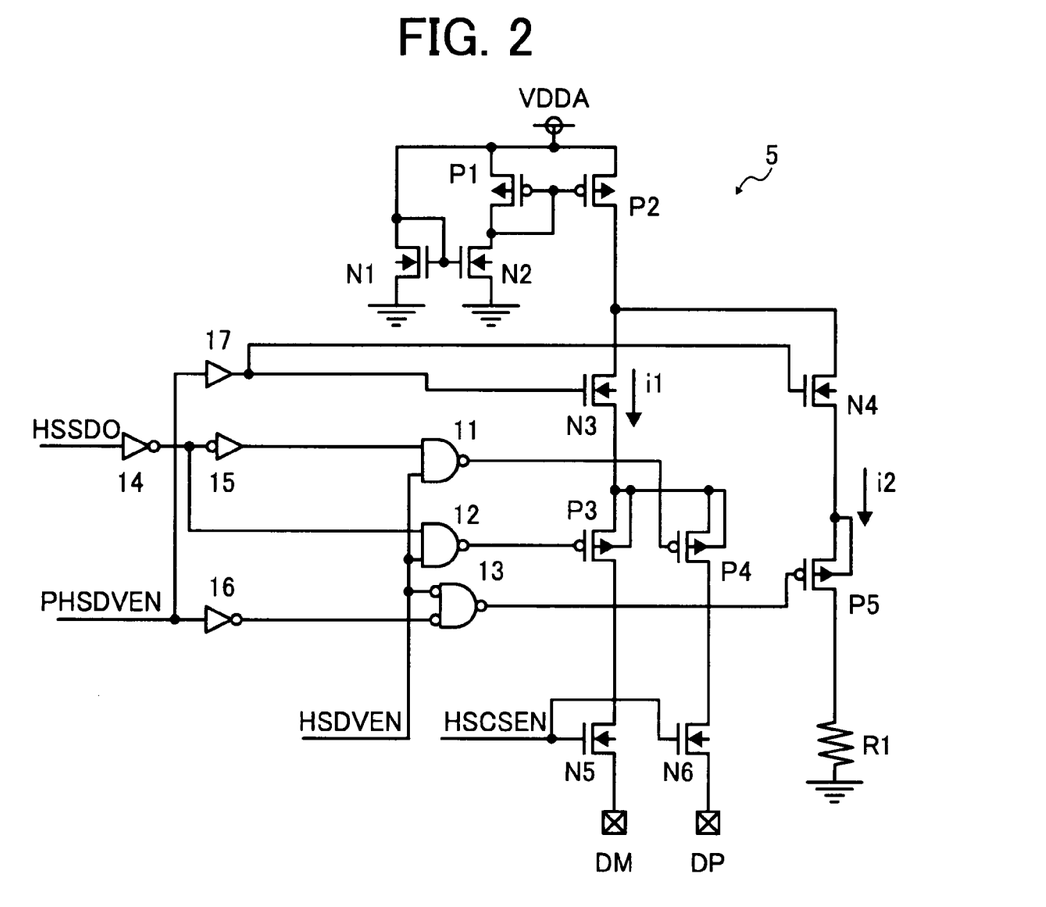
FIG. 2 illustrates an example circuit of a current-driven differential driver.

FIG. 2 illustrates an example circuit of the current-driven differential driver 5. The current-driven differential driver 5 may further include NAND circuits 11 and 12, an OR circuit 13, inverters 14 to 16, a buffer 17, NMOS transistors N1 to N6, PMOS transistors P1 to P5, and a resistance R1. In FIG. 2, i1 represents a current and i2 represents a throwaway current that is passed not for an operation of the current-driven differential driver 5, but for stabilizing the constant current source.

The NMOS transistors N1 and N2, and the PMOS transistors P1 and P2 function as the constant current source. Each of the NMOS transistors N1 and N2, and the PMOS transistors P1 and P2 includes a source, a gate, and a drain. The NMOS transistors N1 and N2 form a current mirror circuit. Each of the sources of the NMOS transistors N1 and N2 is connected to a ground voltage. The gates of the NMOS transistors N1 and N2 are connected to each other. The connection is connected to the drain of the NMOS transistor N1 that is connected to a power source voltage VDDA.

The PMOS transistors P1 and P2 form a current mirror circuit. Each of the sources of the PMOS transistors P1 and P2 is connected to the power source voltage VDDA. The gates of the PMOS transistors P1 and P2 are connected to each other. The connection is connected to the drain of the PMOS transistor P1 that is connected to the drain of the NMOS transistor N2. The drain of the PMOS transistor P2 functions as an output node of the constant current source.

NMOS transistor N4, PMOS transistor P5, and resistance R1 are connected in series between the drain of PMOS transistor P2 and a ground voltage. The NMOS transistor N3, the PMOS transistor P3, and the NMOS transistor N5 are connected in series between the drain of the PMOS transistor P2 and the output terminal DM. The PMOS transistor P4 and the NMOS transistor N6 are connected in series between the source of the NMOS transistor N3 and the output terminal DP.

The control signal PHSDVEN is input into each gate of the NMOS transistor N3 and N4 via the buffer 17. The control signal HSCSEN is input into each gate of the NMOS transistors N5 and N6. The NAND circuits 11 and 12 and the OR circuit 13 include a pair of input nodes and an output node, respectively. The serial data signal HSSDO is input into one of the input nodes of the NAND circuit 12 via the inverter 14, in addition to one input node of the NAND circuit 11 via the inverters 14 and 15.

The control signal HSDVEN is input into each of the other input nodes of the NAND circuits 11 and 12 and one of the input nodes of the OR circuit 13. The control signal PHSDVEN is input into the other input node of the OR circuit 13 via the inverter 16. The output node of the NAND circuit 11 connects to the gate of the PMOS transistor P4. The output node of the NAND circuit 12 is connected to the gate of the PMOS transistor P3. The output node of the OR circuit 13 is connected to the gate of the PMOS transistor P5.

Figure 3:
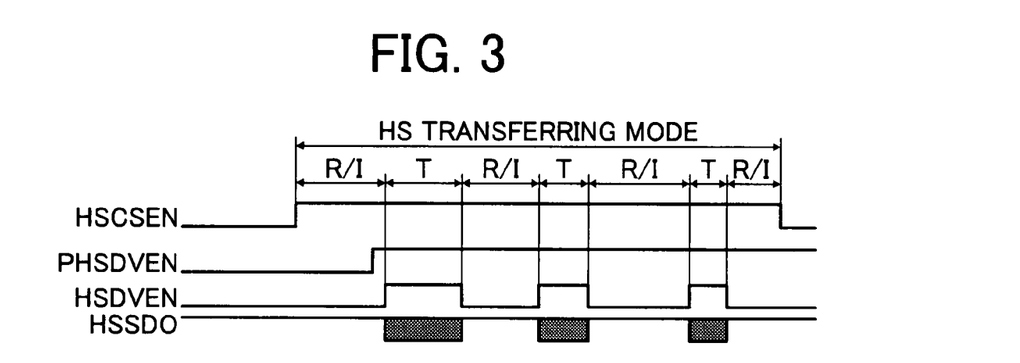
FIG. 3 is an example timing chart of signals from a control sequencer to the current-driven differential driver.

FIG. 3 is an example timing chart illustrating the control signals HSDVEN, PHSDVEN, and HSCSEN, and the serial data signal HSSDO that are input into the current-driven differential driver 5 from the control sequencer 6. Referring to FIG. 3, example operations of the current-driven differential driver 5 is described below, based on the above signals. In FIG. 3, R represents a data reception period, T represents a data transmission period, and I represents an idle period.

During a period of the high-speed transferring mode, the control signal HSCSEN is at a high level and the NMOS transistors N5 and N6 are turned on. The control signal HSDVEN is at a high level during a data transmission period T and at a low level during a data reception period and an idle period. After a predetermined or reference time T1 (first predetermined time) passes after the control signal PHSDVEN becomes high, the control signal HSDVEN becomes high. The first predetermined time T1 is not shorter than a time required for the current source in the current-driven differential driver 5 to be stabilized after becoming operational. For example, when it takes 100 nanoseconds for the current source in the current-driven differential driver 5 to be stabilized, the control signal PHSDVEN becomes high 100 nanoseconds before the HSDVEN becomes high.

Therefore, the NMOS transistors N3 and N4 are turned on in FIG. 2. The OR circuit 13 outputs a low-level signal and the PMOS transistor P5 is turned on. In this time, the NAND circuits 11 and 12 output high-level signals, respectively, because the control signal HSDVEN is at the low level. The PMOS transistors P3 and P4 are turned off to be out of conduction.

Therefore, the current from the constant current source, which includes the NMOS transistors N1 and N2 and PMOS transistors P1 and P2, flows to the ground voltage as a throwaway current i2 via the NMOS transistor N4, the PMOS transistor P5, and the resistance R1 in FIG. 2. The throwaway current i2 is output from the constant current source to stabilize the constant current source before data transmitting.

When the control signal HSDVEN turns to high, the NAND circuits 11 and 12 open the respective gate, and the OR circuit 13 closes the gate thereof. For example, the NAND circuit 11 outputs the signal input from the inverter 15. The NAND circuit 12 outputs the signal input from the inverter 14. The OR circuit 13 outputs a high-level signal regardless of the signal input from the inverter 16.

As a result, the PMOS transistor P5 is turned off to be non-conductive, which disconnects the flow of the throwaway current i2. Either of the PMOS transistors P3 and P4 is exclusively turned on, corresponding to the serial data signal HSSDO. Accordingly, a current i1 is output from either one of the output terminals PM and DP.

When the control signal HSCSEN becomes low, the NMOS transistors N5 and N6 are turned off to be non-conductive, which stops current outputs from the output terminals DM and DP regardless of the states of the control signal HSDVEN and the serial data signal HSSDO. However, the throwaway current i2 flows according to the control signal PHSDVEN.

Figure 4:
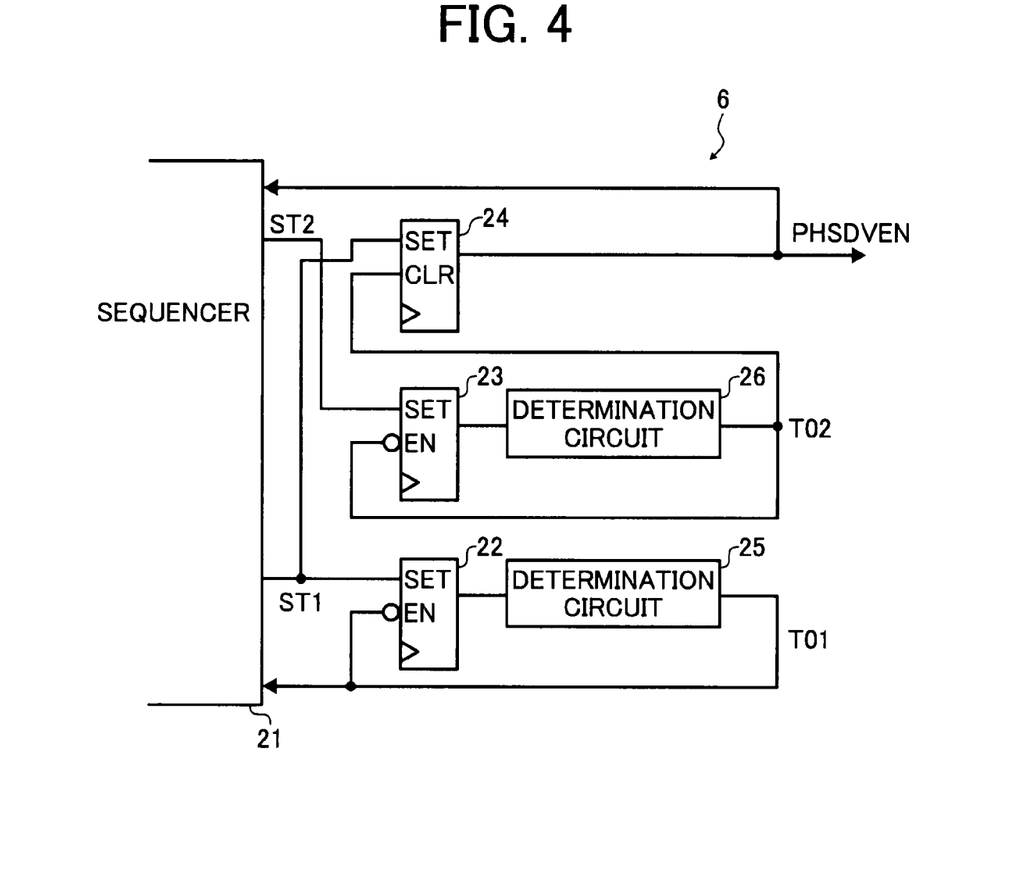
FIG. 4 illustrates an example internal configuration of the control sequencer.
Figure 5:
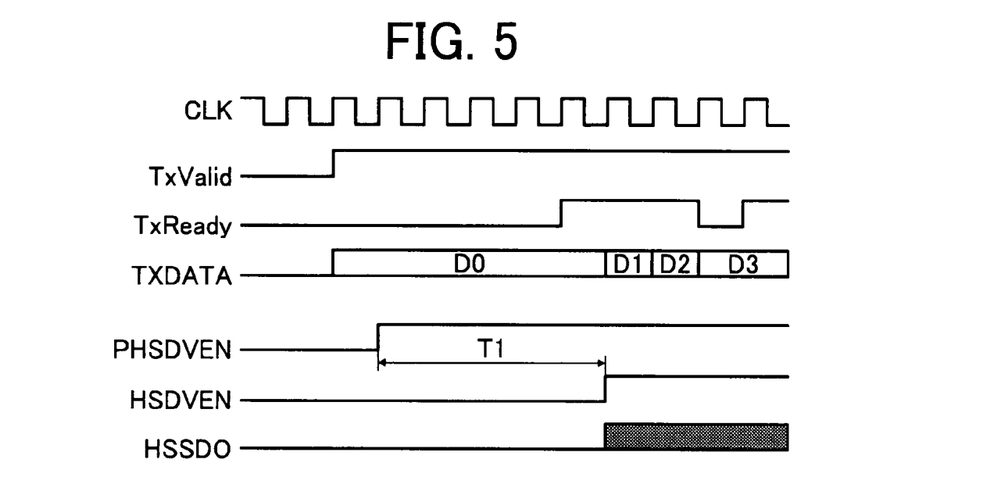
FIG. 5 is an example timing chart of signals in FIG. 1.
Figure 6:
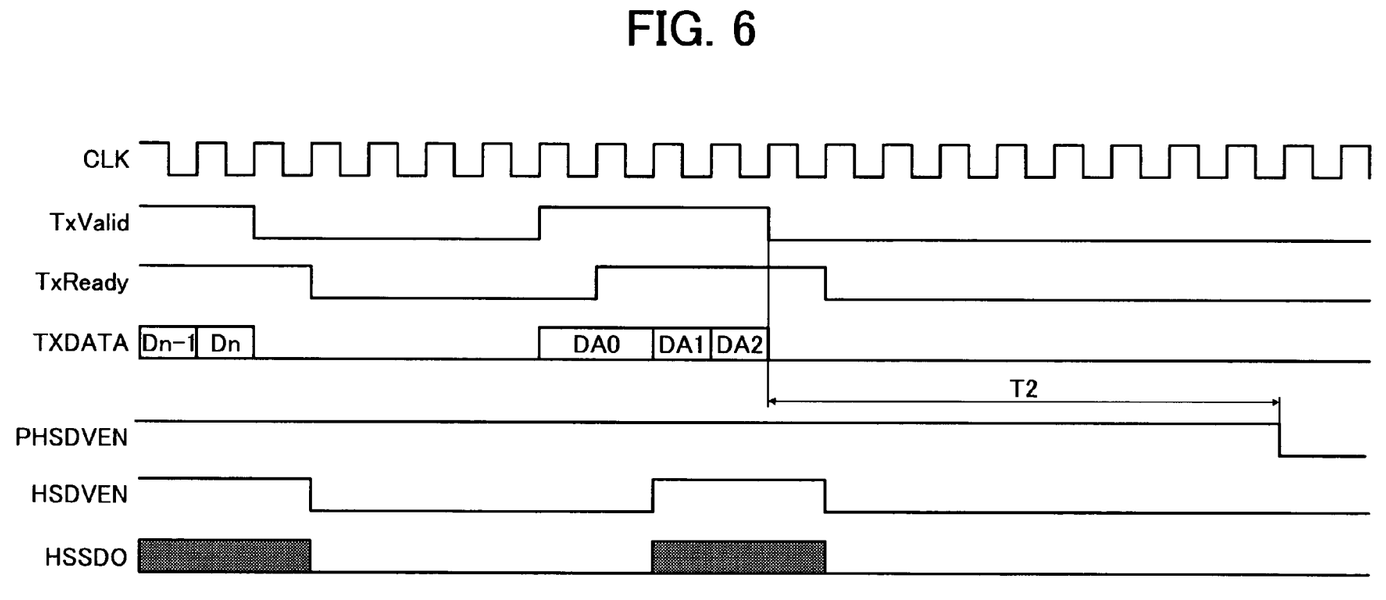
FIG. 6 is an example timing chart of the signals in FIG. 1.

FIG. 4 is an example of a partial internal configuration of the control sequencer 6. FIGS. 5 and 6 are example timing charts of the signals included in FIG. 1. Referring to FIGS. 4 to 6, operations of the sequencer 6 for generating the control signal PHSDVEN is described. FIG. 5 is an example timing chart when the semiconductor device 1 enters a data transmission state initially or after a relatively long data reception period or idle period. FIG. 6 is an example timing chart when the semiconductor device 1 becomes a next data transmission state after a relatively short data reception period or idle period.

In FIG. 4, a part for generating the control signal PHSDVEN is illustrated. The control sequencer 6 may include a sequencer 21, counters 22 and 23, a flip-flop 24, and determination circuits 25 and 26. Each of the counters 22 and 23 include a set (SET) terminal and an enable (EN) terminal. The flip-flop 24 includes a set terminal and a clear (CLR) terminal.

The sequencer 21 operates according to a predetermined or desirable sequence and outputs first and second set time signals ST1 and ST2. The counters 22 and 23 are decrement counters, each configured to perform a countdown. The determination circuit 25 generates and outputs a first predetermined or reference timeout signal TO1 when determining that the counting of a predetermined or reference number is completed based on a count value from the counter 22. The determination circuit 26 generates and outputs a second predetermined or reference timeout signal TO2 when determining that the count of a predetermined or reference number is completed based on a count value from the counter 23.

The first set time signal ST1 from the sequencer 21 is input into the set terminal of the counter 22. The counter 22 sets a predetermined or reference count value corresponding to the first set time signal ST1. The counter 22 decrements the count value for each clock cycle of the clock signal CLK input therein and outputs a decremented count while a high-level signal is input into the enable terminal thereof.

The count value from the counter 22 is input into the determination circuit 25. The determination circuit 25 determines whether or not the count value is zero and outputs a signal corresponding to a determination result to each of the sequencer 21 and the enable terminal of the counter 22. For example, the determination circuit 25 outputs a low-level signal when the count value is zero and a high-level signal when the count value is not zero. The counter 22 decrements the count value for each clock of the clock signal CLK input therein while the enable terminal is at a high level.

Similarly, the second set time signal ST2 from the sequencer 21 is input into the set terminal of the counter 23. The counter 23 sets a predetermined or reference count value corresponding to the second set time signal ST2. The counter 23 decrements the count value for each clock cycle of the clock signal CLK input therein and outputs a decremented count while a high-level signal is input into the enable terminal thereof.

The count value from the counter 23 is input into the determination circuit 26. The determination circuit 26 determines whether or not the count value is zero and outputs a signal corresponding to a determination result to each of the enable terminal of the counter 23 and the clear terminal of the flop-flop 24. For example, the determination circuit 26 outputs a low-level signal when the count value is zero and a high-level signal when the count value is not zero. The counter 23 decrements the count value for each clock of the clock signal CLK input therein while the enable terminal is at a high level. The output signal from the flip-flop 24 is the control signal PHSDVEN. The control signal PHSDVEN is output to the sequencer 21.

In FIGS. 5 and 6, arbitrary data is numbered as data D0, D1, D2, D3, Dn−1, Dn, DA0, DA1, and DA2. The semiconductor device 1 (interface) firstly transmits data D0 to Dn in succession, and then transmits data DA1 to DA3 in succession after a relatively short data reception period or idle period.

With the above configuration, when the parallel data signal TXDATA is output and the request signal TxValid becomes high in FIG. 5, the sequencer 21 initializes the count value of the counter 22 by using the first set time signal ST1. The sequencer 21 causes the counter 22 to start counting and to output the count value to the determination circuit 25. Further, the sequencer 21 causes the flip-flop 24 to output a high-level control signal PHSDVEN.

In FIG. 5, when a first predetermined time T1 (first predetermined time) passes after the counter 22 starts counting, the count value of the counter 22 decreases to zero. The determination circuit 25 outputs the first timeout signal (e.g., high-level timeout signal) TO1 showing that the count value is zero. Receiving the first timeout signal TO1, the counter 22 stops counting and the sequencer 21 turns the control signal HSDVEN to high. Simultaneously, the sequencer 21 in the control sequencer 6 controls the encoder 3 (FIG. 1) so that the serial data signal HSSDO is output (FIG. 5) from PS conversion circuit 4 (FIG. 1) and input into the current-driven differential driver 5 (FIG. 1).

When the input of data D0 to Dn and DA0 to DA2 from the SIE 2 completes, the request signal TxValid turns low in FIG. 6. At this time, the sequencer 21 initializes the count value of the counter 23 with the second set time signal ST2 and then causes the counter 23 to start counting. Further, the sequencer 21 causes the counter 23 to output the count to the determination circuit 26. After a second predetermined time T2 (second predetermined time) for example, 100 nanoseconds, after the counter 23 starts counting, the count value of the counter 23 becomes zero. The determination circuit 26 outputs the second timeout signal TO2 (e.g., high level timeout signal TO2) showing that the count value is zero. Receiving the second timeout signal TO2, the counter 23 stops counting and the flip-flop 24 turns the control signal PHSDVEN to the low level.

Meanwhile, when the request signal TxValid becomes high again before the second predetermined time T2 passes after the counter 23 starts counting in FIG. 6, the sequencer 21 detects that the control signal PHSDVEN is at the high level. The sequencer 21 does not allow the counter 22 to count and stops the counter 23 to count. When the request signal TxValid becomes low again, the sequencer 21 causes the counter 23 to start counting from an initial count value and to output the count value to the determination circuit 26.

As described above, in an example embodiment, a measurement of the second predetermined time T2 is stopped when the request signal TxValid becomes high before the second predetermined time T2 passes. The measurement of the second predetermined time T2 is performed again after the request signal TxValid becomes low. The control signal PHSDVEN is turned low only the case where the request signal TxValid does not become high until the second predetermined time T2 passes.

Figure 7:
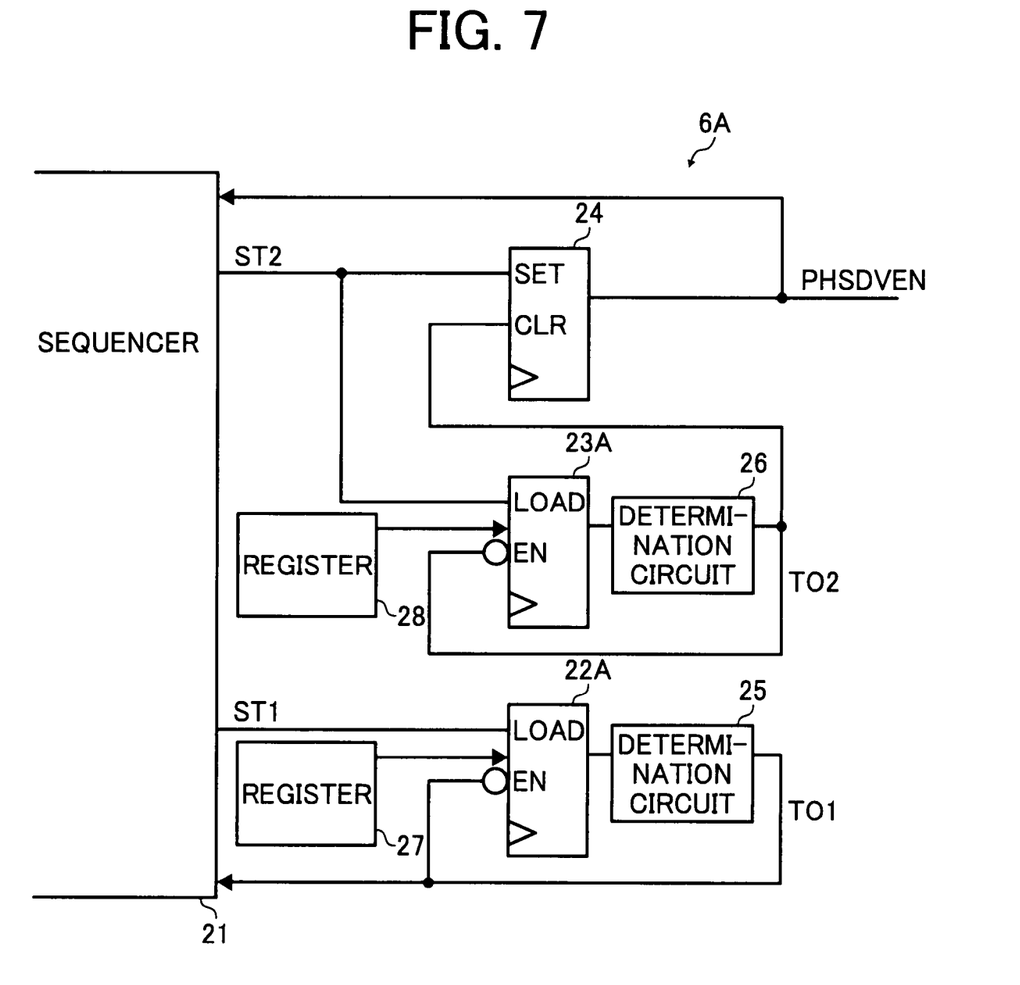
FIG. 7 illustrates an example internal configuration of the control sequencer.

The control sequencer 6 may include at least one register in which the second predetermined time T2 is externally set. FIG. 7 illustrates a control sequencer 6A that may be used instead of the control sequencer 6 in FIG. 4. The control sequencer 6A includes a sequencer 21, timers 22A and 23A, a flip-flop 24, determination circuits 25 and 26, and registers 27 and 28. Each of the timers 22A and 23A is a decrement counter having a load terminal LOAD and an enable terminal EN.

The second predetermined time T2 is externally settable in the registers 27 and 28. The first set time signal ST1 from the sequencer 21 is input into the LOAD terminal of the timer 22A. The timer 22A loads a predetermined or reference count value from the register 27 according to the first set time signal ST1. Similarly, the second set time signal ST2 from the sequencer 21 is input into the load terminal of the timer 23A. The timer 23A loads a predetermined or reference count value from the register 28 according to the second set time signal ST2. In other respects, the control sequencer 6A functions similarly to the control sequencer 6 in FIG. 4.

Figure 8:
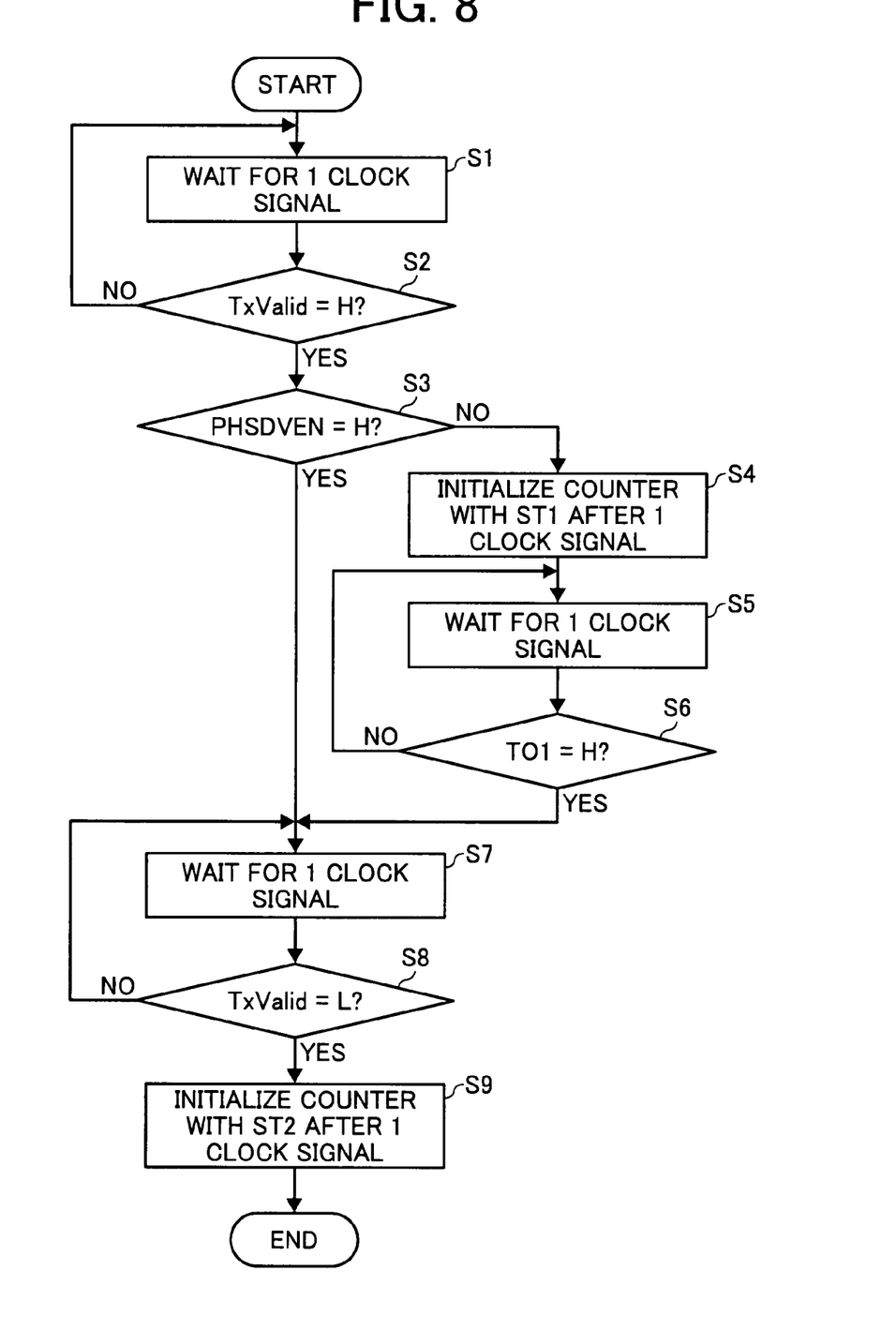
FIG. 8 is a flowchart of example operations of a sequencer.

FIG. 8 is a flowchart showing example operations of the sequencer 21. Operations in the flowchart of FIG. 8 are performed by the sequencer 21 unless otherwise specified.

In FIG. 8, the sequencer 21 waits for one clock cycle of the clock signal CLK at S1. At S2, the sequencer 21 checks whether or not the request signal TxValid is at the high level. When the request signal TxValid is at the low level (NO) at S2, the sequencer 21 returns to S1. When the request signal TxValid is at the high level (YES) at S2, the sequencer 21 checks whether or not the control signal PHSDVEN is at the high level at S3.

When the control signal PHSDVEN is at the high level (YES) at S3, the sequencer 21 proceeds to S7. When the control signal PHSDVEN is at the low level (NO) at S3, the sequencer 21 proceeds to S4. At S4, the sequencer waits for one clock cycle of the clock signal CLK, initializes the count value of the counter 22 with the first set time signal ST1, and causes the counter 22 to start counting. Next, the sequencer 21 waits for one clock cycle of the clock signal CLK at S5 and then checks whether or not the first timeout signal TO1 is at the high level at S6. When the first timeout signal TO1 is at the low level (NO) at S6, the sequencer 21 returns to S5.

When the first timeout signal TO1 is at the high level (YES) at S6, the sequencer 21 waits for one clock cycle of the clock signal CLK at S7 and then checks whether or not the request signal TxValid becomes low at S8. When the request signal TxValid is high (NO) at S8, the sequencer 21 returns to S7. When the request signal TxValid is low at S8, the sequencer 21 waits for one clock cycle of the clock signal CLK at S9. Further, the sequencer 21 initializes the count value of the counter 23 with the second set time signal ST2 and causes the counter 23 to start counting.

As described above, in the semiconductor device 1 according to an embodiment, the throwaway current for stabilizing the current source in the current-driven differential driver continuously flows therein when data is frequently transmitted. The throwaway current is stopped when there is no data transmission for a predetermined time or longer. Therefore, an electric consumption of the current-driven differential driver may be reduced, while a waiting time for each data transmission is not required.

Further, an upper-level program may set when to stop the throwaway current because the predetermined time is externally settable. Therefore, the time to stop the throwaway current is optically selectable depending on various transmission conditions. When the current-driven differential driver is used for a high-speed serial data transferring unit, the electric consumption of the high-speed serial data transferring unit may be reduced.

This invention may be conveniently implemented using a conventional general purpose digital computer programmed according to the teachings of the present specification, as will be apparent to those skilled in the computer art. Appropriate software coding can readily be prepared by skilled programmers based on the teachings of the present disclosure, as will be apparent to those skilled in the software art. The present invention may also be implemented by the preparation of application specific integrated circuits or by interconnecting an appropriate network of conventional component circuits, as will be readily apparent to those skilled in the art.

Numerous additional modifications and variations are possible in light of the above teachings. It is therefore to be understood that within the scope of the appended claims, the disclosure of this patent specification may be practiced otherwise than as specifically described herein.

What is claimed as new and desired to be protected by Letters Patent of the United States is:

1. A semiconductor device, comprising:
   a current-driven differential driver configured to generate a pair of signals having levels relative to each other from a serial signal input therein and to output a current generated by a current source included therein through an output node according to each of the signals; and
   a control circuit configured to control the current-driven differential driver,
   wherein the current-driven differential driver is controlled to pass the current as a throwaway current which is not for an operation therein during a second predetermined time after an input of the serial signal therein starts, then stops, and to block the throwaway current after the second predetermined time passes, and wherein the control circuit has a measuring part configured to measure the second predetermined time when the input of the serial signal stops and the current-driven differential driver is controlled to block the throwaway current when the measuring part outputs a signal indicating that the second predetermined time has passed.

2. The semiconductor device of claim 1, wherein the measuring part of the control circuit is configured to measure the second predetermined time according to a control signal and output a predetermined signal after the second predetermined time passes; and the control circuit further comprises a controlling part configured to control an operation of the measuring part and the operation of the current-driven differential driver according to a measurement result of the measuring part.

3. The semiconductor device of claim 1, wherein the second predetermined time is externally settable.

4. The semiconductor device of claim 1, wherein the control circuit controls the current-driven differential driver to pass the throwaway current therein a first predetermined time before the input of the serial signal, the first predetermined time being prior to the second predetermined time.

5. The semiconductor device of claim 4, wherein the first predetermined time is not shorter than a time required for the current source in the current-driven differential driver to stabilize an operation after starting the operation.

6. A semiconductor device, comprising:
   a current-driven differential driver configured to generate a pair of signals having levels relative to each other from a serial signal input therein and to output a current generated by a current source included therein through an output node according to each of the signals; and a control circuit configured to control the current-driven differential driver, wherein the current-driven differential driver is controlled to pass the current as a throwaway current which is not for an operation therein during an externally settable second predetermined time after an input of the serial signal therein starts, then stops, and to block the throwaway current after the second predetermined time passes, wherein the control circuit further comprises a register in which the second predetermined time is set.

7. A method of controlling a current-driven differential driver configured to generate a pair of signals having conflicting levels from a serial signal input therein and output a current from a current source included therein through an output node according to each of the signals, the method comprising:

passing the current from the current source as a throwaway current which is not for an operation therein during a second predetermined time after an input of the serial signal stops, determining that the second predetermined time has passed by measuring a period of time after the input of the serial signal stops; and blocking the throwaway current after determining that the second predetermined time has passed.

8. The method of controlling a current-driven differential driver of claim 7, further comprising passing the throwaway current a first predetermined time before the input of the serial signal, the first predetermined time being prior to the second predetermined time.

9. The method of controlling a current-driven differential driver of claim 8, wherein the first predetermined time is not shorter than a time required for the current source to stabilize an operation after starting the operation.

10. The method of controlling a current-driven differential driver of claim 7, wherein determining that the second predetermined time has passed comprises counting an externally set number of clock cycles.

11. The method of controlling a current-driven differential driver of claim 10, wherein the externally set number of clock cycles is retrieved from a register.

* * * * *